(12) United States Patent
Tanaka

(10) Patent No.: US 7,157,983 B2
(45) Date of Patent: Jan. 2, 2007

(54) CUT OF PIEZOELECTRIC OSCILLATOR, PIEZOELECTRIC OSCILLATOR, AND PIEZOELECTRIC DEVICE

(75) Inventor: Masako Tanaka, Okaya (JP)

(73) Assignee: Seiko Epson Corporation (JP)

(*) Notice: Subject to any disclaimer, the term of this patent is extended or adjusted under 35 U.S.C. 154(b) by 36 days.

(21) Appl. No.: 10/803,480

(22) Filed: Mar. 18, 2004

(65) Prior Publication Data

US 2004/0251774 A1 Dec. 16, 2004

(30) Foreign Application Priority Data

Mar. 19, 2003 (JP) .............................. 2003-076245

(51) Int. Cl.
*H03B 5/32* (2006.01)
*H03H 9/19* (2006.01)

(52) U.S. Cl. .................... 331/158; 310/361; 310/313 A (58) Field of Classification Search ................ 331/158; 310/361, 313 A
See application file for complete search history.

(56) References Cited

U.S. PATENT DOCUMENTS 6,316,861 B1 * 11/2001 Ballandras et al. ..... 310/313 A

2003/0218512 A1 * 11/2003 Zhang et al. ................ 331/158

FOREIGN PATENT DOCUMENTS

| JP | 10-284978 | 10/1998 |
|---|---|---|
| JP | 11-225040 | 8/1999 |
| JP | 2000-040937 | 2/2000 |
| JP | 2003-037462 | 2/2003 |
| JP | 2004-7420 | 1/2004 |

OTHER PUBLICATIONS

John R. Vig, "Quartz Crystal Resonators and Oscillators", Jan. 200, SLCET-TR-88-1, p. 3-17.*

* cited by examiner

*Primary Examiner*—Joseph Chang
(74) *Attorney, Agent, or Firm*—Harness, Dickey & Pierce, P.L.C.

(57) ABSTRACT

A cut of a piezoelectric resonator uses a quartz plate having an electric axis, mechanical axis, and optic axis on an X axis, Y axis, and Z axis, respectively. An X' axis is set by rotating the X axis with an angle of 3–30 degrees in a clockwise direction about the Z axis. A Z' axis is set by rotating the Z axis in the clockwise direction with an angle of 33–36 degrees about the X' axis. The quartz plate has sides parallel to the X' axis and Z' axis, respectively. Furthermore, the plate has sides parallel to X" axis and Z" axis, respectively, which have been rotated in the clockwise direction with angles of from −35 degrees to −2 degrees about a Y' axis that is the thickness direction of the cut of the piezoelectric resonator.

4 Claims, 10 Drawing Sheets

CUT OF PIEZOELECTRIC OSCILLATOR, PIEZOELECTRIC OSCILLATOR, AND PIEZOELECTRIC DEVICE

RELATED APPLICATIONS

This application claims priority to Japanese Patent Application No. 2003-076245 filed Mar. 19, 2003 which is hereby expressly incorporated by reference herein in its entirety.

BACKGROUND OF THE INVENTION

1. Technical Field

The present invention relates to a cut of a resonator making use of a piezoelectric effect and, more particularly, to a cut of a piezoelectric resonator, piezoelectric resonator, and piezoelectric device using a so-called new cut quartz plate.

2. Related Art

As various kinds of electronic devices have been advanced and communication systems have evolved in recent years, piezoelectric devices typified by piezoelectric resonators have been used frequently. Especially, quartz acting as a piezoelectric material has enjoyed wide acceptance in piezoelectric devices, because high frequencies are obtained and stable frequency characteristics are provided. AT-cut quartz plates (hereinafter simply abbreviated AT-cut plates) have been used in piezoelectric devices for a long time because piezoelectric resonators having stable frequency characteristics in a wide temperature range are obtained. Such an AT-cut plate has one side parallel to the X axis and has been cut at a cut angle obtained by rotating the XZ-plane with 35.25 degrees in a clockwise direction (as viewed from the −X direction of the X axis to the +X direction) about the X axis.

In recent years, however, as resonator and so on have been packed at increasing densities, the operating temperatures have been elevated. Also, it has become necessary to set the operating temperatures of the resonators higher. Therefore, a doubly-rotated resonator whose cut angles are rotated about two axes has been devised instead of the conventional AT-cut resonator.

If a quartz plate (doubly-rotated substrate) cut out with cut angles rotated relative to two axes among the crystallographic axes (electric axis, mechanical axis, and optic axis) of quartz is used, it has been theoretically demonstrated that the central temperature of the frequency-temperature characteristics shifts to the higher temperature side. In a temperature range of from −25° to +100° C., cut angles providing stable frequencies exist (for example, see Japanese Patent No. 3,218,537).

The doubly-rotated substrate can provide stable frequency-temperature characteristics in this way. At the same time, many spurious modes occur compared with the main mode. Many frequency jumps or resistance value increases occur due to mechanical oscillation coupling of spurious modes with the main mode. Many of the spurious modes are contour vibrations depending on the longer or shorter sides of blanks or are modes of combinations of them. Accordingly, when a blank is designed, its shape must be determined carefully such that no spurious modes exist near the frequency of the main mode.

Figure 3:
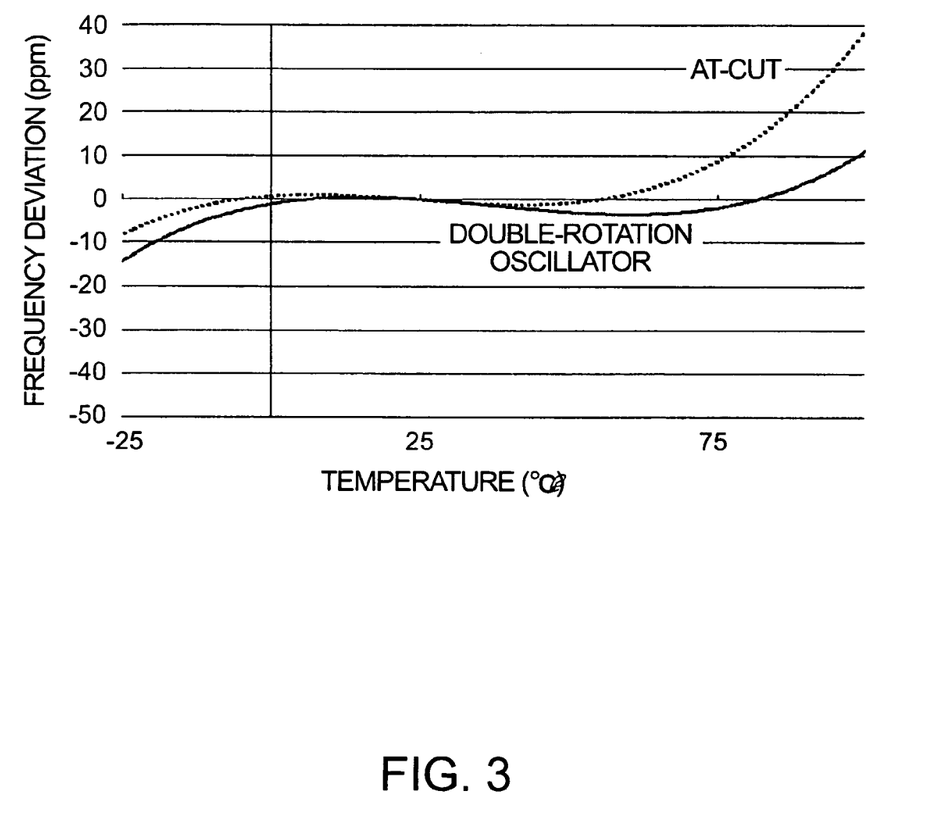
FIG. 3 shows the frequency-temperature characteristics of a doubly-rotated resonator with $\phi=10°$ and $\theta=34.9°$

The temperature characteristics of the doubley-rotated resonator are as shown in FIG. 3 when the frequency-temperature characteristics in the temperature range from −25° C. to +100° C. of the resonator are taken which has rotated with 34.9 degrees about the X axis after rotating 10 degrees about the Z axis, for example. In the figure, the dotted line indicate the frequency-temperature characteristics of the conventional AT-cut resonator. It can be seen that the doubly-rotated resonator shows more stable frequency-temperature characteristics in higher temperature regions as compared to the AT-cut resonator. In this doubly-rotated resonator, the frequency-temperature characteristics have a point at which the gradient of the tangential line is 0 near approximately 25° C. in the case of the AT-cut. The temperature at this point is hereinafter referred to as the central temperature. In contrast, the doubly-rotated resonator has the phenomenon that the central temperature varies from 25° C. to 100° C. or higher depending on the rotational angle φ.

The characteristics of the doubly-rotated resonator described so far are useful. However, more spurious modes (undesired modes) having other modes of vibration are produced than the conventional AT-cut resonator. For example, contour vibrations depending on the longer and shorter sides of the blank vary in frequency due to deviation in blank contour. Therefore, if the frequency comes too close to that of the main modes, both vibrations are mechanically coupled, causing jumps in the frequency of the main modes or resistance increases. Similarly, in the temperature range of from −25° C. to 100° C. taken as operating temperatures, spurious modes occur at certain temperatures near the main modes. This produces the phenomenon that the frequency of the main modes deviates or the resistance value increases. Similar phenomena are observed with AT-cut resonators. Especially, in the case of double rotations, these phenomena occur frequently. The present inventors have investigated the cause using an analytical method known as the finite element method.

As a result, we have found that the cause is the direction of displacement of thickness shear mode that is the main mode. The conventional AT-cut resonator produces a thickness shear mode whose direction of displacement is only in the X-direction. On the other hand, the direction of displacement of the doubly-rotated resonator has all of the components of X, Y, and Z. The phenomenon of a frequency shift or resistance increase caused by spurious mode is due to the fact that the main and spurious mode have common displacement components and thus cause coupling of vibrations (resonance). That is, the main modes of the AT-cut resonator couple with vibration having only X-direction displacement components. However, the doubly-rotated resonator has displacement components of three directions and so there arises the possibility that coupling with the majority of spurious modes occurs.

SUMMARY

The present inventors have calculated the displacement vector on the surface of a doubly-rotated cut quartz blank, i.e., within the plane formed by the X' axis and Z' axis and produced a clockwise in-plane rotation about the Y" axis such that the X" axis extends along the direction of displacement vector. A new rectangular blank has been cut so that both sides are parallel to the resulting new X" axis and Z" axis, respectively.

That is, the present invention provides a cut of a piezoelectric resonator comprising a quartz plate made of a quartz having an electric axis lying on an X axis, a mechanical axis lying on a Y axis, and an optic axis lying on a Z axis, the plate having a side parallel to an X' axis established by rotating the X axis in a clockwise direction about the Z axis with an angle of from 3 degrees to 30 degrees to form X' and Y' axes, the quartz plate further having a side parallel to a Z' axis obtained by rotating the Z axis and Y' axis about the X' axis in the clockwise direction with an angle of from 33 degrees to 36 degrees to form the Z' and Y" axes. This cut of a piezoelectric resonator is characterized in that the quartz plate has sides parallel to X" axis and Z" axis, respectively, which have been rotated with angles of from −35 degrees to −2 degrees in the clockwise direction about the Y" axis that is the thickness direction of the cut of the piezoelectric resonator.

In the cut of a piezoelectric resonator according to the present invention, the frequency of the main mode is stable against various shapes and hardly varies even if spurious modes come close to the main modes. The possibility that frequency jumps or resistance increases take place is low.

In the present invention, "clockwise direction about an axis" is a direction taken from the negative side to the positive side of the axis. Accordingly, "clockwise direction about the Z axis" means "clockwise direction as viewed from the −Z direction to the +Z direction".

A piezoelectric resonator according to the present invention consists of any one of the above-described cuts of a piezoelectric resonator and can provide improved stability of frequency against machining errors of the longer and shorter sides of a blank. In addition, a piezoelectric resonator having a stable frequency in a wide temperature range of from −25° C. to +100° C. is obtained.

Also, a piezoelectric device according to the present invention is characterized in that it is fitted with the above-described piezoelectric resonator. As a result, more machining errors are tolerated in mass production steps, and a stable frequency is obtained. Consequently, where the temperature range used is wide as in automobile parts, the frequency can be stabilized without the need of a temperature compensation circuit. The cost can be decreased by avoiding increases in the number of components and number of manufacturing steps.

BRIEF DESCRIPTION OF THE DRAWINGS

FIGS. 13(A) and 13(B) are explanatory views of a piezoelectric resonator according to an embodiment.

DETAILED DESCRIPTION

The preferred embodiments of cut of a piezoelectric resonator, piezoelectric resonator, and piezoelectric device according to the present invention are described in detail with reference to the accompanying drawings.

Figure 1:
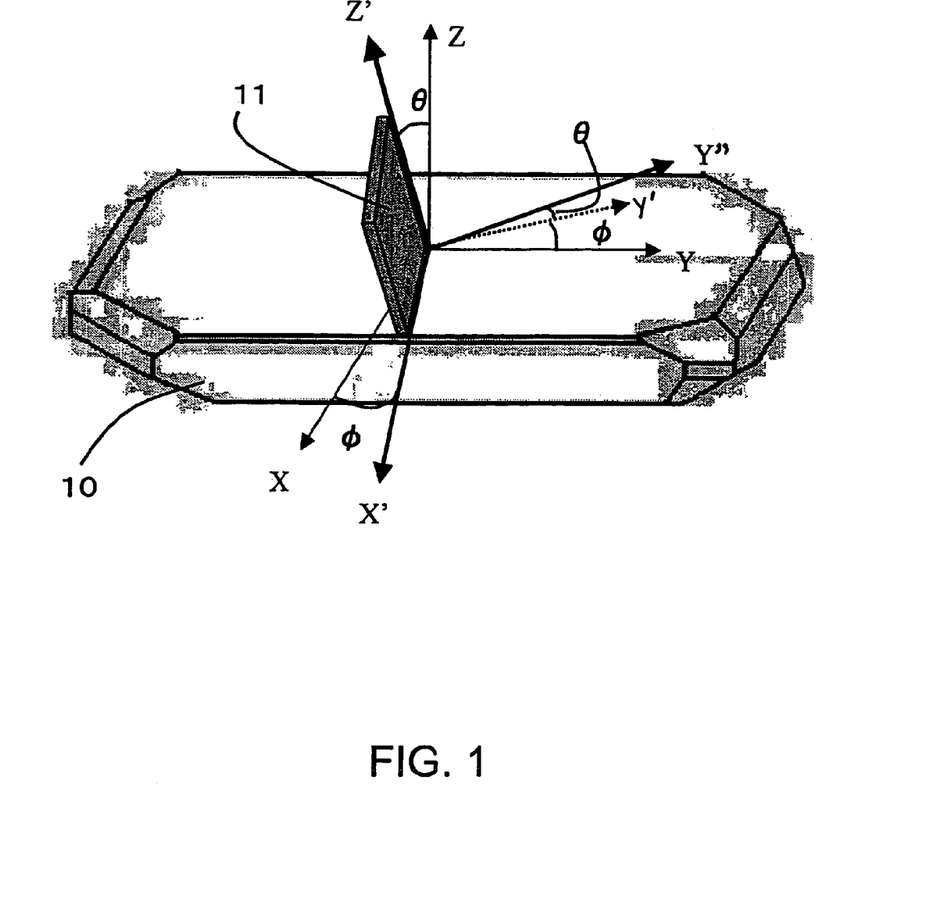
FIG. 1 is an explanatory view of doubly-rotated cut angles forming the basis of embodiments of the present invention.
Figure 2:
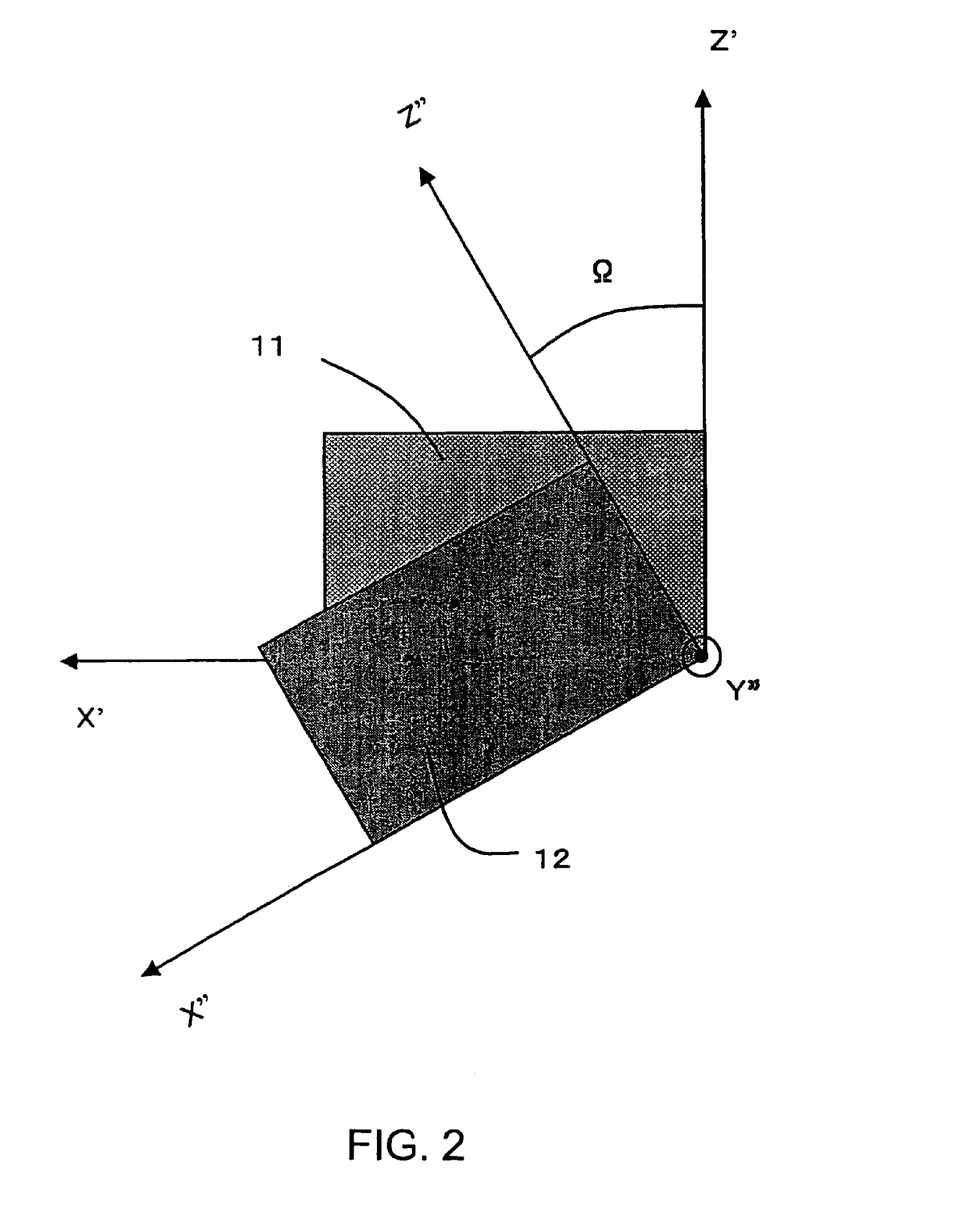
FIG. 2 is an explanatory view of a cut angle according to an embodiment of the invention.

FIGS. 1 and 2 are views illustrating cut angles of quartz for obtaining a cut of quartz resonator that is a cut of a piezoelectric resonator according to the present invention. In FIG. 1, three axes of a quartz crystal 10 crossing perpendicularly to each other, i.e., electric axis, mechanical axis crossing perpendicularly to the electric axis, and optic axis crossing perpendicularly to those axes are taken as X axis, Y axis, and Z axis, respectively. With respect to the cut angles of the doubly-rotated cut-angled quartz plate (quartz substrate) 11 defined in the present invention, an X' axis obtained by rotating the X axis about the Z axis with merely $\phi$ in a clockwise direction is first established. The plate has sides parallel to the X' axis. Furthermore, the quartz plate 11 has sides parallel to a Z' axis obtained by rotating the Z axis in the clockwise direction with merely $\theta$ about the X' axis.

A cut of quartz 12 according to the invention is a cut of quartz having sides parallel to an X" axis and a Z" axis obtained by rotating the quartz plate 11 about the Y" axis with merely angle $\Omega$ as shown in FIG. 2. In this figure, +direction of the Y" axis is a direction directed from the rear surface of the paper to the front.

The present inventors have conducted various discussions on the cut angles of the quartz crystal 10 which have been rotated about the X axis, Z axis, and Y" axis and have found that the present cut-angled resonator suffers from less frequency jumps and resistance increases due to spurious modes in various forms than the conventional doubly-rotated resonator. Furthermore, the temperature characteristics are more stable.

Figure 4:
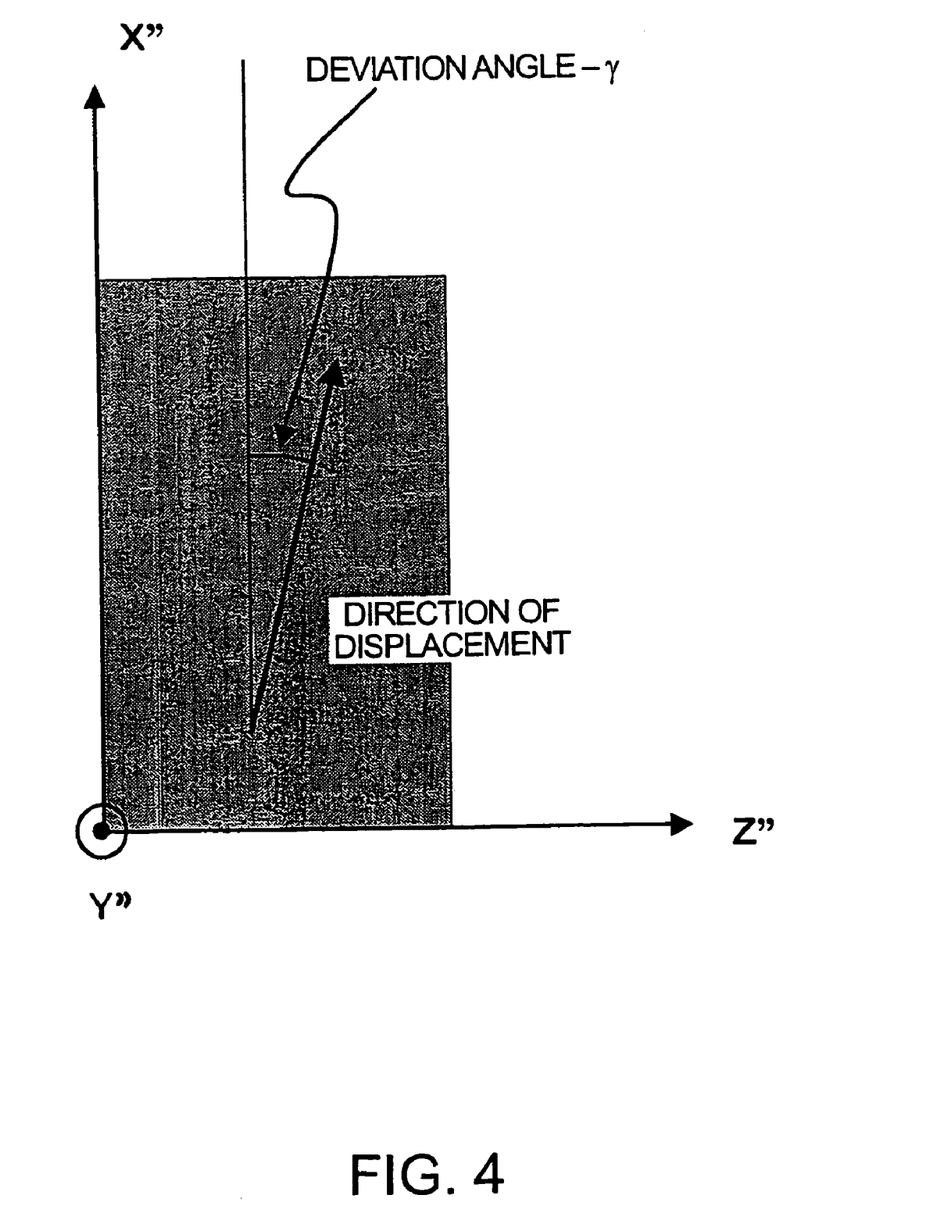
FIG. 4 is a diagram illustrating the direction of displacement of main modes on the plane of the doubly-rotated resonator.
Figure 5:
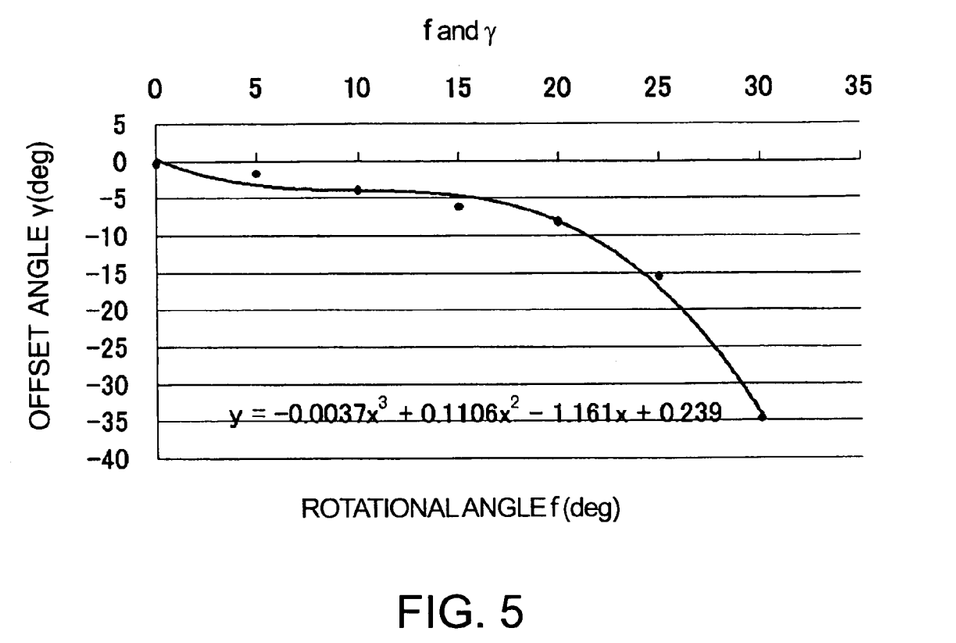
FIG. 5 is a graph showing the relation between the rotational angle $\phi$ about the Z axis and the deviation $\gamma$ of displacement from the direction of the longer sides.

As shown in FIG. 4, the calculated result of the direction of displacement of the main modes on the doubly-rotated cut quartz 11 reveals that the direction of displacement of the main modes is not parallel to the direction of the longer side on the X" axis but has a deviation angle $\gamma$ as indicated by the arrow in the figure. FIG. 5 shows the computationally derived results of the direction of displacement of the main modes on the doubly-rotated cut quartz 11 when the rotational angle $\phi$ about the Z axis is varied. The lateral axis indicates the rotational angle $\phi$ about the Z axis, while the vertical axis indicates the deviation $\gamma$ in the direction of displacement. These are represented by defining the clockwise direction relative to the +Y" axis as positive (+). As can be seen from the figure, as the rotational angle $\phi$ increases, the deviation $\gamma$ between the X" axis and the direction of displacement increases in one direction.

Accordingly, the blank is rotated about the Y" axis within the plane formed by the X' axis and Z' axis with merely γ such that the direction of the longer sides of the blank becomes parallel to the direction of displacement of the main modes.

Figure 6:
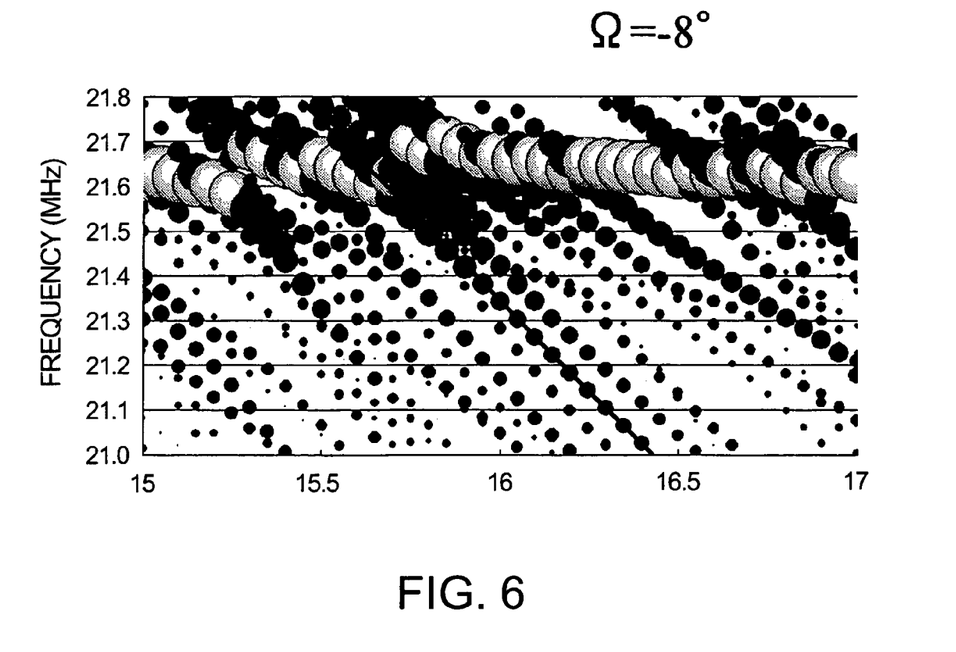
FIG. 6 shows the relation between the Z side ratio and frequency in a case where the direction of displacement is parallel to the direction of the longer sides.
Figure 7:
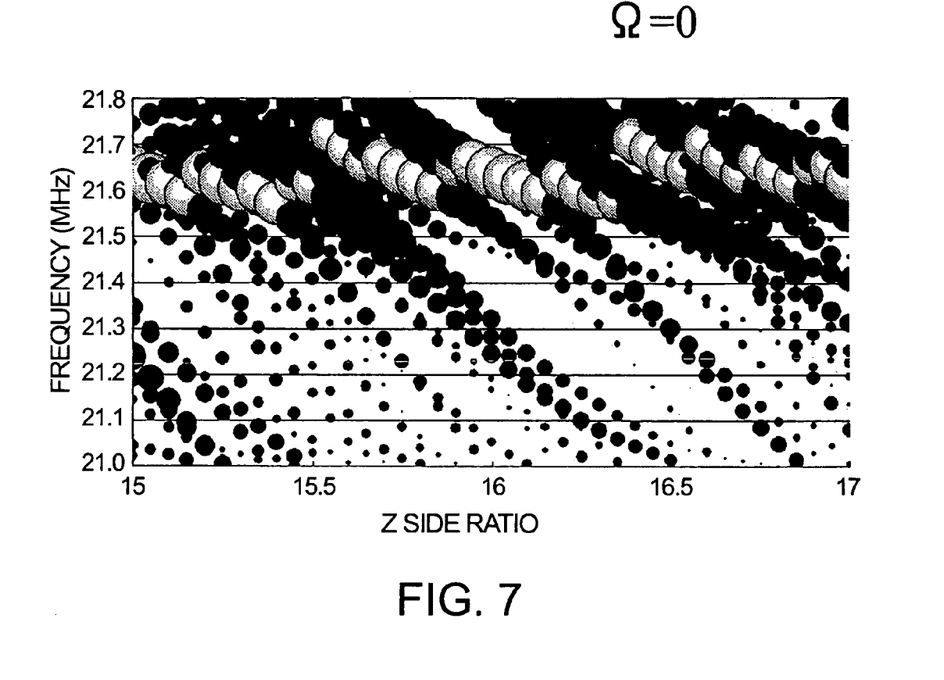
FIG. 7 shows the relation between the Z side ratio and frequency in a case where the direction of displacement deviates 8 degrees from the direction of the longer sides.
Figure 8:
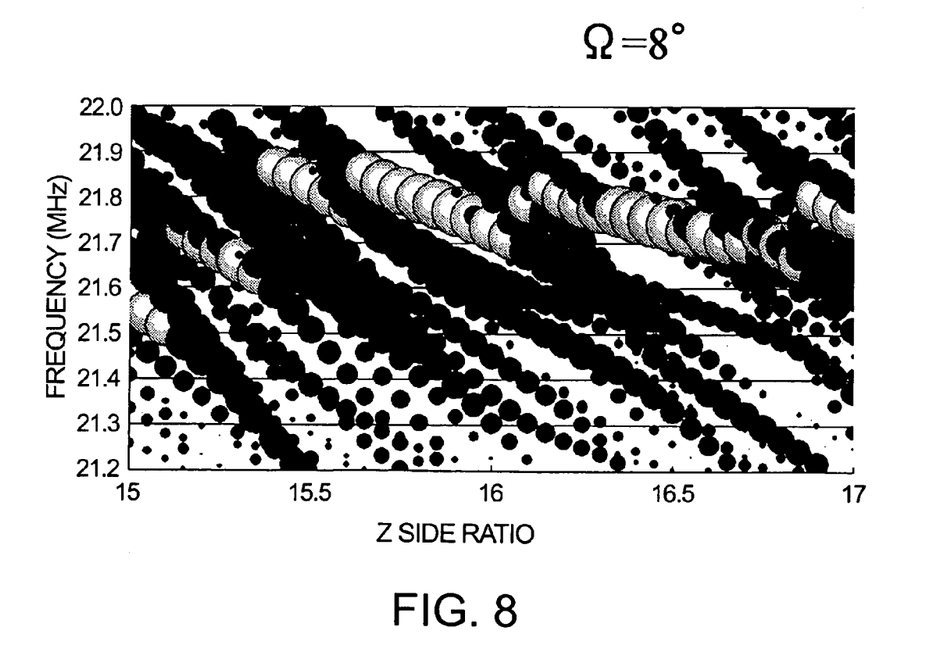
FIG. 8 shows the relation between the Z side ratio and frequency in a case where the direction of displacement deviates 16 degrees from the direction of the longer sides.

This rotational angle is Ω. For example, the degrees of the deviation of the frequency of the main modes due to spurious modes were calculated for a case where the direction of displacement is parallel to the direction of the longer sides and for a case where the direction of displacement is not parallel. Also, the degrees of increase in the resistance value were calculated. It is now assumed that the sides parallel to the X" axis are the longer sides and that the sides parallel to the Z" axis are the shorter sides. The results are shown in FIGS. 6–8. The lateral axis of each figure is the Z side ratio, i.e., the length of the shorter sides of the blank divided by the thickness of the quartz. The vertical axis indicates the frequency. Here, φ is 20 degrees, and the longer sides of the blank has a constant length of 2.0 mm. In the figures, the frequency positions of main modes are indicated by the white dots. The frequency positions of spurious modes are indicated by the black dot group. The size of each dot corresponds to the intensity of each mode. A larger dot indicates a stronger vibration. For example, the lines in FIG. 6 indicate the motion of a certain spurious mode. As the Z side ratio of the blank increases, the spurious position shifts to the lower frequency side. It can be understood, on the other hand, that the main modes are almost constant regardless of the Z side ratio and that when the spurious modes are approached, the frequency shifts greatly due to vibration coupling. At the same time, the dots of the spurious modes increase in size. Hence, it can be inferred that the vibration intensities increase compared with the main modes. At this time, the main modes are deprived of their vibration energies by spurious modes and so the vibration intensities of the main modes decrease. That is, the resistance values of the main modes increase.

The figures are compared. FIG. 6 shows a case where the direction of displacement is made parallel to the direction of the longer sides of the blank. The rotational angle Ω about the Y" axis is −8 degrees. FIG. 7 shows a case where Ω is 0, i.e., the direction of the longer sides deviates 8 degrees from the direction of displacement at the doubly-rotated cut angle. FIG. 8 shows a case where Ω is 8 degrees and the direction of the longer sides deviates 16 degrees from the direction of displacement. It can be seen from the comparison of the three figures that the frequency shifts are small and spurious modes are not so strong in FIG. 6 where the direction of displacement is parallel to the direction of the longer sides. However, as can be seen from FIGS. 7 and 8, as the deviation from the parallel relation between the direction of displacement and the direction of the longer sides increases, variation width of frequency increases, and the vibration intensity of the whole spurious mode increases.

After checking these facts computationally, resonators using cuts of quartz according to the present invention were prototyped under conditions of φ of 20 degrees and θ of 34.0 degrees. Doubly-rotated cut-angled quartz resonators of this construction were rotated about the Y" axis with angles Ω of −8 degrees, 0 degrees, and 8 degrees, respectively. The longer and shorter sides of each blank were made parallel to the X" axis and Z" axis after rotation within the plane. In the present prototypes, the longer sides were kept constant. Each shorter side was varied by varying the Z side ratio from 15.0 to 17.0, and the frequency of the main modes of each cut resonator was measured.

Figure 9:
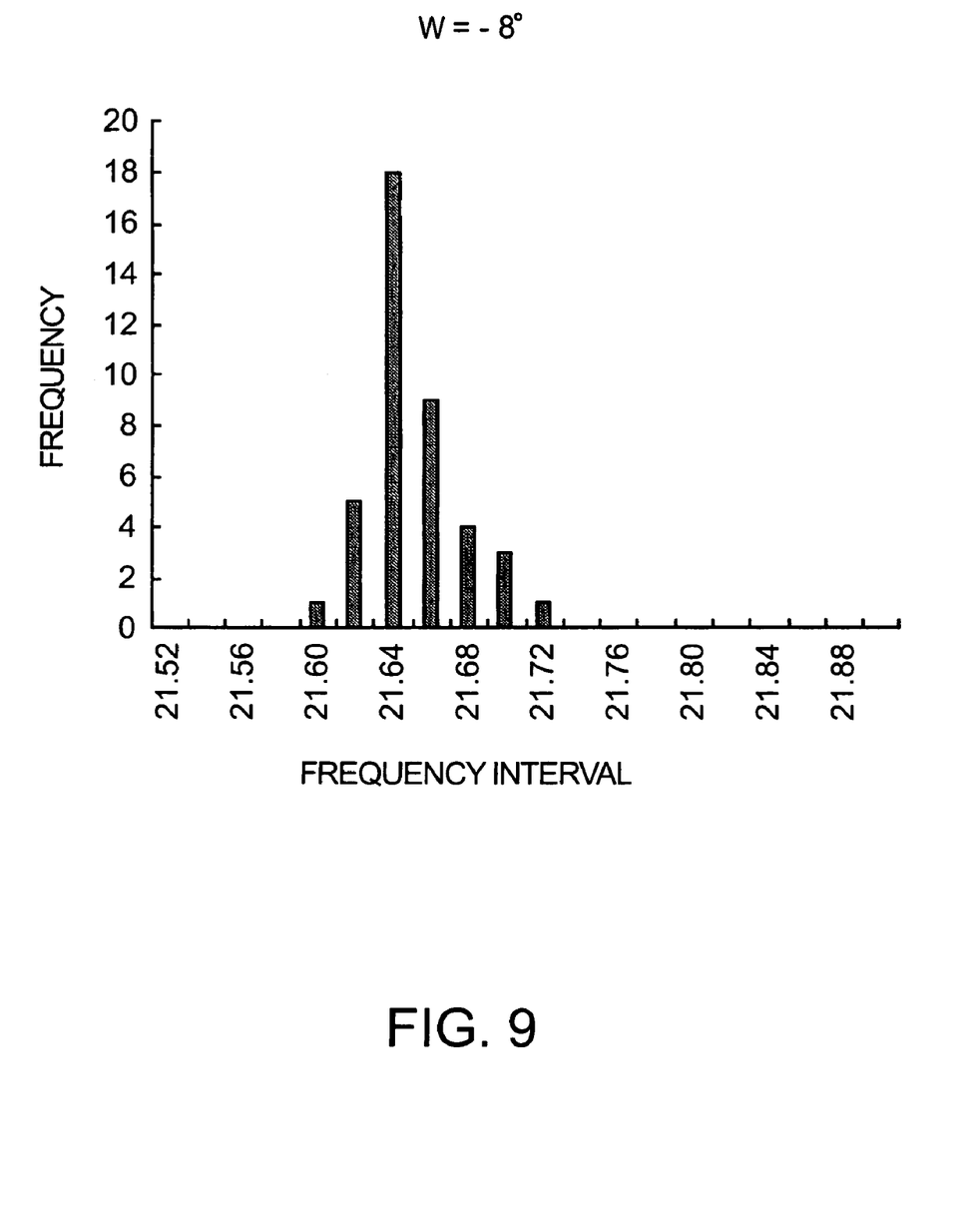
FIG. 9 is a frequency distribution of variations in main mode frequencies of various shapes in a case where the direction of displacement is parallel to the direction of the longer sides.
Figure 10:
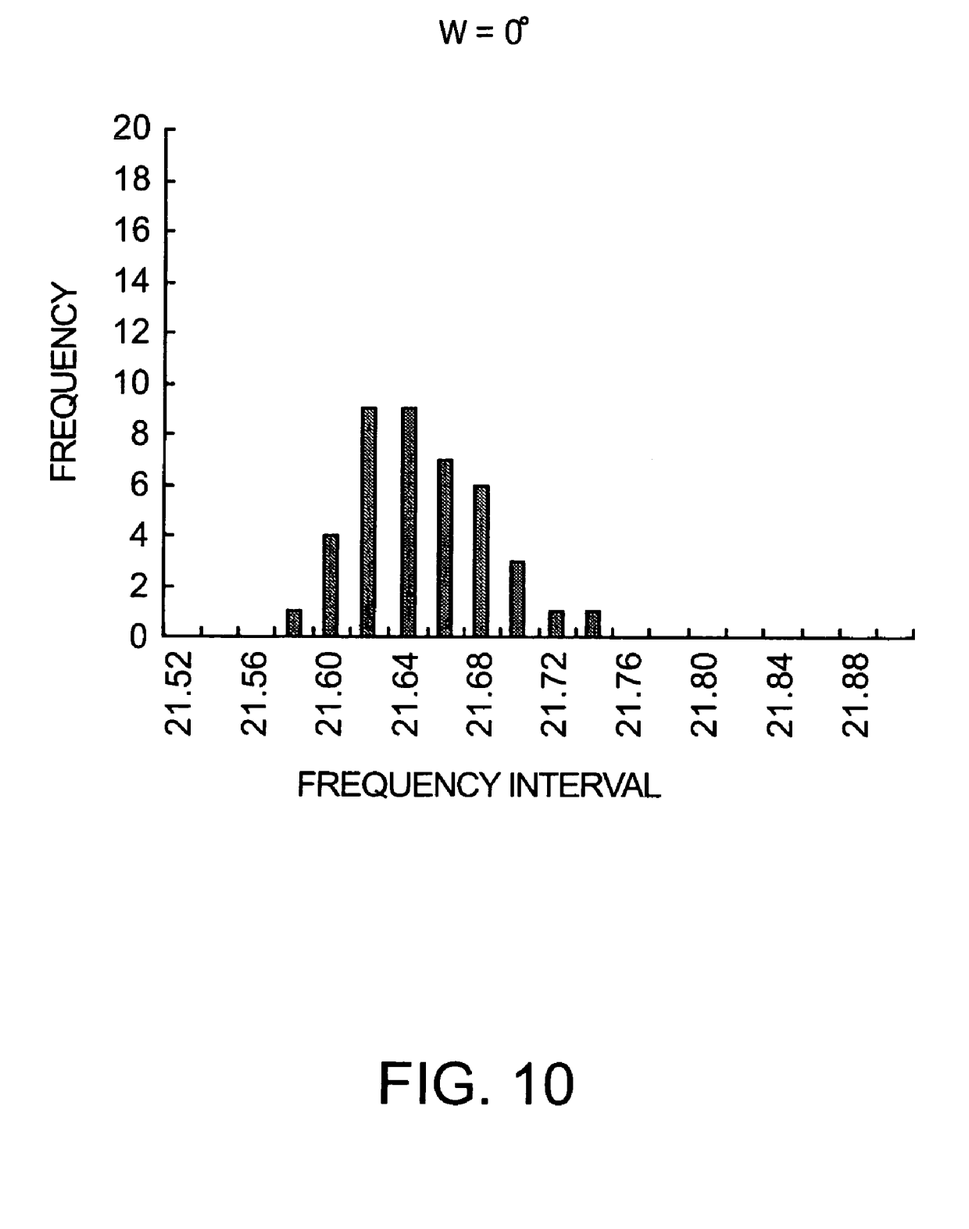
FIG. 10 shows the frequency distributions of variations in the main mode frequencies of various shapes in the case where the direction of displacement deviates 8 degrees from the direction of the longer sides.
Figure 11:
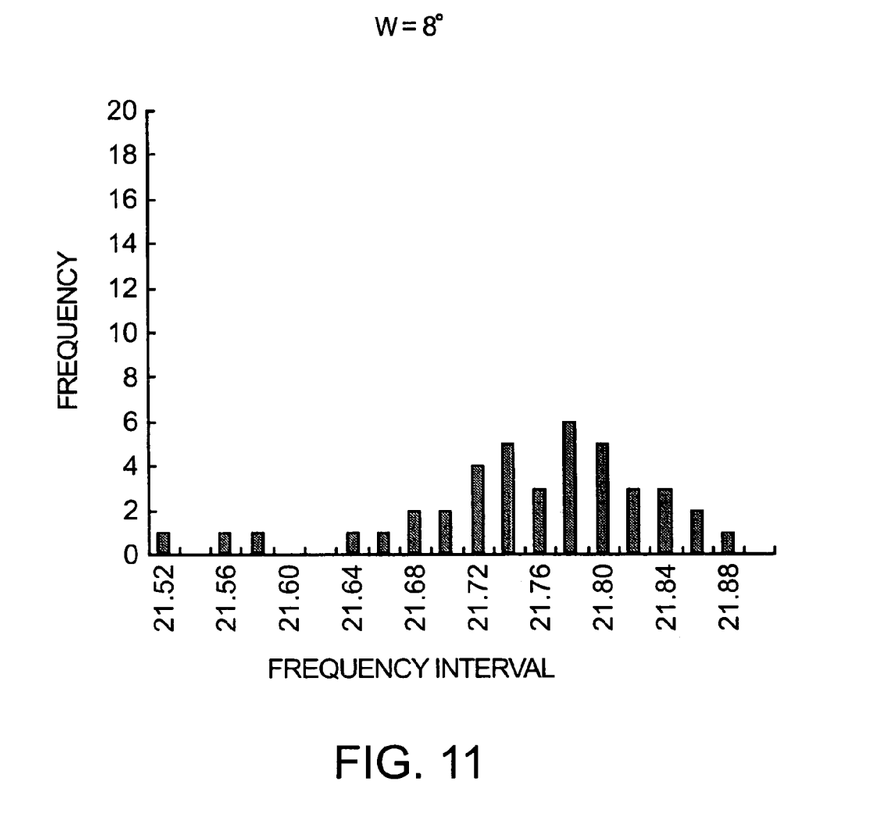
FIG. 11 shows the frequency distributions of variations in the main mode frequencies of various shapes in the case where the direction of displacement deviates 16 degrees from the direction of the longer sides.

FIGS. 9, 10, and 11 represent the frequency distributions of the results of the measurements described above. In FIG. 9, the direction of displacement of the main modes is parallel to the direction of the longer sides. In FIG. 10, the direction of the longer sides deviates 8 degrees from the direction of displacement. In FIG. 11, the deviation is 16 degrees. In FIG. 9, frequency variations are smaller than in FIGS. 10 and 11. Also, the variation width increases with increasing deviation, for the causes considered below. As the deviation from the parallel relation increases, many vibration couplings with spurious modes occur in various shapes, causing jumps of the frequency of main modes. Because of these results, it can be seen that a stable frequency is obtained irrespective of the shape of the cut resonator by making the direction of the longer sides parallel to the direction of displacement.

Figure 12:
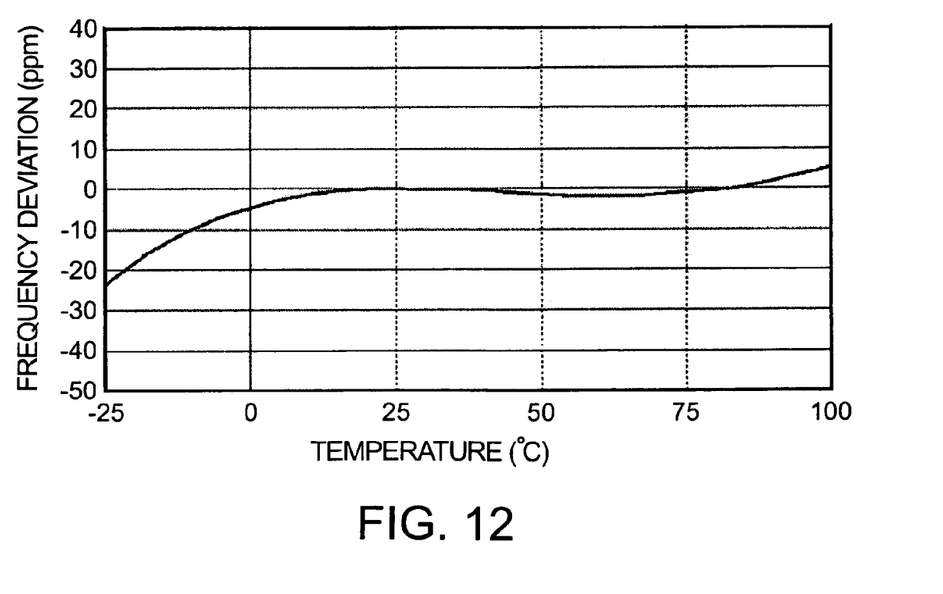
FIG. 12 is a diagram showing the frequency-temperature characteristics of a cut of a quartz resonator according to the invention under conditions of $\phi=10°$, $\Omega=-8.0°$, and $\theta=34.85°$.

The frequency-temperature curves of the cut resonators according to the invention were measured. The results are shown in FIG. 12. A stable frequency of main modes can be obtained over a wide temperature range comparable to the frequency-temperature characteristics of the doubly-rotated resonators shown in FIG. 3. It has been confirmed that rotation about the Y" axis hardly affects the temperature characteristics.

The results above show that in the doubly-rotated cut-angled resonator, displacement of the main modes is not parallel to the direction of the longer sides and so coupling with spurious modes existing thereabout easily occurs. As a result, frequency jumps and resistance value increases occur easily. To avoid them, it is desirable to rotate Ω within the range from −35 degrees to −2 degrees within the plane at the cut angle of double rotation. However, where φ is less than 3 degrees, the direction of displacement is almost parallel to the direction of the longer sides and so in-plane rotation about the Y' axis is not necessary. Where φ is greater than 30 degrees, the central temperature of the temperature characteristic curve becomes too high with impractical results. Therefore, the range of φ from 3 degrees to 30 degrees is desirable. In this range of φ, the range of θ in which the gradient of the tangential line to the frequency-temperature curve is 0 near the central temperature is greater than 33 degrees and less than 36 degrees as given by $$-35 \leq \Omega \leq -2 \qquad \text{Equation 2}$$

wherein, $3.0 \leq \phi \leq 30$ $33.0 \leq \theta \leq 36.0$

Especially, the relation between φ and Ω that satisfies the function of Eq. (3) shown in FIG. 5 is considered to be the optimum condition. However, the region in which the frequency-temperature curves of the doubly-rotated cut resonator are good differs slightly depending on the side ratio and on the amount of plateback using the electrodes. This causes a deviation of the optimum region of Ω. Therefore, the width of ±3 degrees of the value of the Ω derived from Eq. (3) is the optimum region in practice. This is given by Eq. (4).

$$\Omega° = (-0.0037 \times \phi^{3+0.1106} \times \phi^2 - 1.161 \times \phi + 0.239)° \qquad \text{Equation 3}$$

$$\Omega° = (-0.0037 \times \phi^{3+0.1106} \times \phi^2 - 1.161 \times \phi + 0.239 \pm 3)° \qquad \text{Equation 4}$$

(wherein, $3.0 \leq \phi \leq 30$)

Figure 13A:
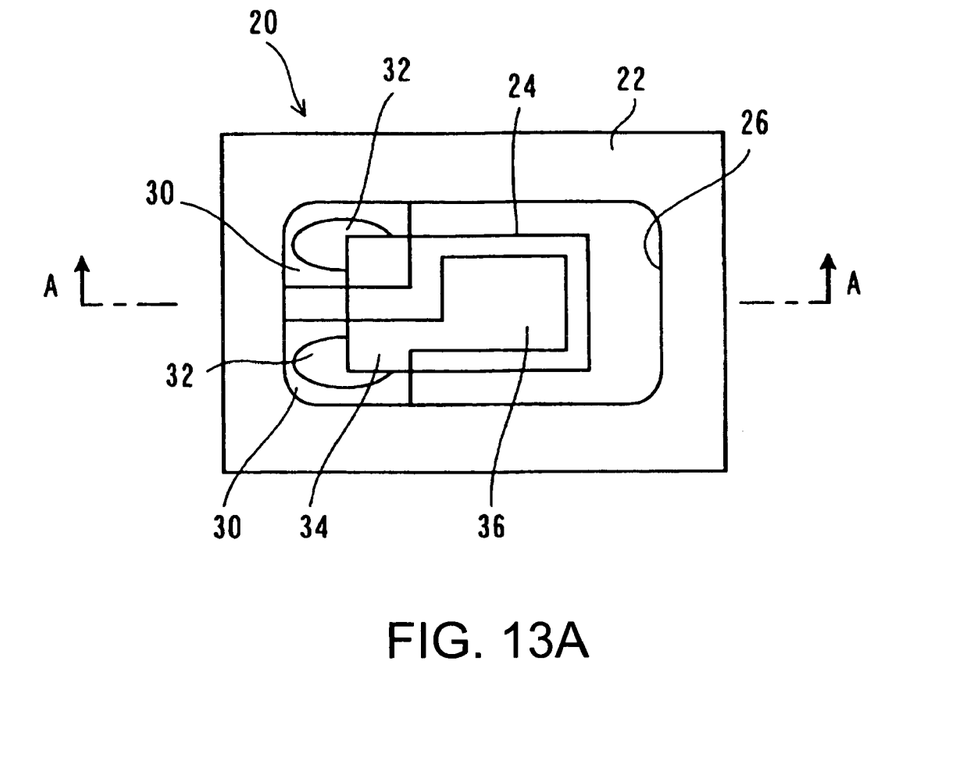
FIG. 13(A) is a cross-sectional view taken along line B—B of FIG. 13(B)
Figure 13B:
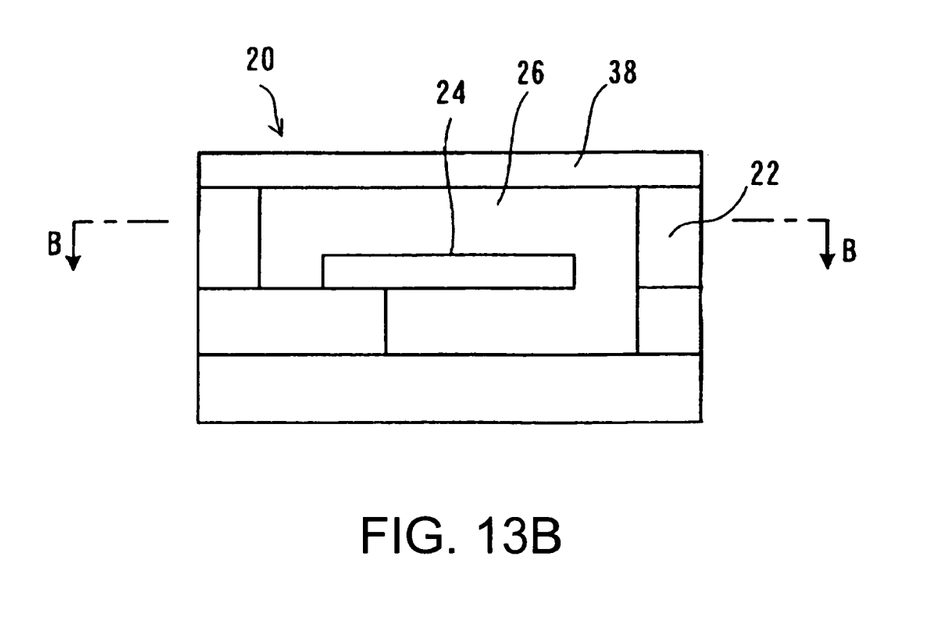
FIG. 13(B) is a cross-sectional view taken along line A—A of FIG. 13(A).

The cut of a piezoelectric resonator (cut of a quartz resonator) consisting of the quartz plate 12 cut out with the cut angle obtained under the above conditions can be used as a piezoelectric resonator by hermetically sealing the cut of the resonator into a package. FIG. 13 gives explanatory views of the piezoelectric resonator. FIG. 13(A) is a plan view in cross section taken on line B—B of FIG. 13(B). FIG. 13(B) is a side elevation in cross section taken on line A—A of FIG. 13(A).

In FIGS. 13(A) and (B), a piezoelectric resonator 20 has a package 22 made of an insulating material such as a ceramic material. The package 22 is provided with a cavity 26 accommodating a cut of a piezoelectric resonator 24. Electrodes 30 and a wiring pattern (not shown) are formed on the bottom surface of the cavity 26 in the package 22 to permit electrical connection with external terminals (not shown) formed on the rear surface of the package 22. The cut of the piezoelectric resonator 24 is cantilevered and mounted in the cavity 26. Specifically, conductive adhesive 32 is applied onto the electrodes 30. Connector electrodes 34 of the cut of the piezoelectric resonator 24 are disposed on the adhesive and made stationary. This makes it possible to electrically energize exciting electrodes 36 of the cut of the piezoelectric resonator 24 from the external terminals on the bottom surface of the package 22. A cover member 38 is mounted on top of the package 22, and the inside of the package 22 is maintained as a nitrogen ambient or the like.

The cut of a piezoelectric resonator according to the present embodiment can be used as a piezoelectric resonator by combining the cut of the piezoelectric resonator with integrated circuit elements and forming an resonator circuit. For example, a piezoelectric resonator module can be formed by mounting the piezoelectric resonator 20 shown in FIGS. 13(A) and (C) and integrated circuit elements (not shown) on a module substrate on which a wiring pattern has been formed. Furthermore, a piezoelectric resonator package can be fabricated by hermetically sealing integrated circuit elements into the package 22 shown in FIGS. 13(A) and (C) together with the cut of the piezoelectric resonator 24.

The cut of a piezoelectric resonator according to the invention can be, for example, planar, convex, or inverted mesa form in which the central portion of the cut of the piezoelectric resonator is recessed.

ADVANTAGES OF THE INVENTION

As described so far, by adopting the cut angle according to the present invention, the frequency of the main modes can be stabilized irrespective of various shapes of the cuts of quartz.

What is claimed is:

1. A cut of a piezoelectric resonator comprising:
a quartz plate having an electric axis on an X axis, a mechanical axis on a Y axis, and an optic axis on a Z axis, said plate having a side parallel to an X' axis established by rotating the X axis and Y axis in a clockwise direction about the Z axis within an angle of from about 3 to 30 degrees to form the X' and Y' axes, said quartz plate further having a side parallel to a Z' axis obtained by rotating the Z axis and Y' axis about the X' axis in the clockwise direction within an angle of from about 33 to 36 degrees to form the Z' and Y'' axes,
wherein the quartz plate has sides parallel to an X'' axis and a Z'' axis, respectively, which have been rotated within angles of from about −35 to −2 degrees in the clockwise direction about the Y'' axis that is a thickness direction of the cut of the piezoelectric resonator.

2. A cut of a piezoelectric resonator as set forth in claim 1, wherein when a rotational angle about the Z axis, a rotational angle about the X' axis, and a rotational angle about the Y'' axis are defined to be $\phi$ degrees, $\theta$ degrees, and $\Omega$ degrees, respectively, and $\Omega° = (-0.0037 \times \phi^3 + 0.1106 \times \phi^2 - 1.161 \times \phi + 0.239 \pm 3)°$ (wherein, $3.0 \leq \phi \leq 30$) is satisfied.

3. A piezoelectric resonator comprising:
the cut of the piezoelectric resonator as set forth in claim 1.

4. A piezoelectric device having a piezoelectric resonator as set forth in claim 3.

* * * * *

UNITED STATES PATENT AND TRADEMARK OFFICE
CERTIFICATE OF CORRECTION

PATENT NO. : 7,157,983 B2
APPLICATION NO. : 10/803480
DATED : January 2, 2007
INVENTOR(S) : Masako Tanaka It is certified that error appears in the above-identified patent and that said Letters Patent is hereby corrected as shown below:

| | |
|---|---|
| Title Page, item 56 References Cited, Other Publications | "January 200" should be --January 2001-- |
| Col. 6, Line 57, Equation 3 | "$\Phi^{3+0.1106}$" should be --$\Phi^3+0.1106$-- |
| Col. 6, Line 60, Equation 4 | "$\Phi^{3+0.1106}$" should be --$\Phi^3+0.1106$-- |
| Col. 7, Line 26 | "an" should be --a-- |

Signed and Sealed this

Seventeenth Day of April, 2007

JON W. DUDAS
*Director of the United States Patent and Trademark Office*